United States Patent [19]

Lievens et al.

[11] Patent Number: 4,787,227
[45] Date of Patent: Nov. 29, 1988

[54] FEED-THROUGH ELEMENT FOR A VACUUM APPARATUS

[75] Inventors: Hugo Lievens, Gent; Wilfried Coppens, Kortrijk-Marke, both of Belgium

[73] Assignee: N.V. Bekaert S.A., Zwevegem, Belgium

[21] Appl. No.: 106,365

[22] Filed: Oct. 9, 1987

[30] Foreign Application Priority Data

Oct. 23, 1986 [NL] Netherlands .................. 8602660

[51] Int. Cl.$^4$ .................. B21D 37/16; C21D 1/74; C23C 14/56
[52] U.S. Cl. .................. 72/38; 72/285; 72/466; 72/468
[58] Field of Search .......... 72/38, 41, 285, 466, 72/467, 468; 34/242; 118/50; 432/242

[56] References Cited

U.S. PATENT DOCUMENTS

| | | | |
|---|---|---|---|
| 1,896,674 | 2/1933 | Longwell | 72/41 |
| 3,417,589 | 12/1968 | Bobrowsky | 72/60 |
| 3,565,448 | 2/1971 | Angelbeck | 24/249 X |
| 3,667,626 | 6/1972 | Torelli et al. | 34/242 X |
| 3,952,568 | 4/1976 | Wareing et al. | 72/38 |

FOREIGN PATENT DOCUMENTS 2315645 1/1977 France .
1428993 7/1973 United Kingdom .

Primary Examiner—E. Michael Combs
Attorney, Agent, or Firm—Foley & Lardner, Schwartz, Jeffery, Schwaab, Mack, Blumenthal & Evans

[57] ABSTRACT

The invention relates to a feed-through element for application in a vacuum apparatus for the continuous feeding through of material with wire character to be treated at least made up of a casing and a sealing element set up therein that is in contact with the surface of the material with wire character during feeding through, whereby the sealing element is formed by a split drawing die (20), whereby the casing is formed by a holder (21;22) for the split drawing die (20), whereby the split drawing die (20) being set up with play inside the holder (21;22) and at least a resilient means (28) being inserted in the space between the drawing die (20) and the holder (21;22) and whereby a part of the holder (21;22) being connected in a gastight way to a partition wall of the vacuum apparatus (1).

5 Claims, 1 Drawing Sheet

FEED-THROUGH ELEMENT FOR A VACUUM APPARATUS

BACKGROUND OF THE INVENTION

The invention relates to a feed-through element for application in a vacuum apparatus for the continuous feeding through of material with wire character to be treated at least made up of a casing and a sealing element set up therein that is in contact with the surface of the material with wire character during feeding through.

Such feed-through element is known from British Patent Specification No. 1,428,933. In said publication is described a tubular feed-through element, which can be inserted in the external wall of a vacuum treatment apparatus or in the partition walls located between the different compartments of such apparatus. Said tubular feed-through elements consist of a casing and also of bored end flanges through which the wire-shaped product to be treated can be fed. Inside the casing there are bored sealing elements of material with a low friction coefficient and/or a good heat resistance, the bore being such that the outer surface of the wire-shaped product to be treated fits closely to the inner surface of the bore.

The term of "vacuum treatment" is in the present application to be understood as referring to every treatment of a material with wire character that takes place in a vacuum environment, such as vacuum deposition, sputtering, plasma precipitation, ion implantation, heat treatments, plasma cleaning, etc.

"Products with a wire character" is to be understood as referring to both single wires and composite wires such as cords or ropes.

A known feed-through element as described hereinabove has the disadvantage that the elements which fit closely around the material with wire character thereby forming a seal are subjected to very high wear, that such wear can show itself in a contamination of the surface of the material fed through and that in the course of time the sealing effectiveness of the sealing elements decreases.

Furthermore, serious damage to the sealing elements may occur in the case of a sudden thickening in the material with wire character, for instance, there where wires have been welded together and where there is still a weld thickening or part of it.

SUMMARY OF THE INVENTION

It is an object of the present invention to provide a feedthrough element of aforesaid type that is not or hardly subject to wear; in order that the sealing effectiveness should remain constant or nearly constant in the course of time and that, furthermore, the occurence of a sudden thickening of the material fed through should not cause wire rupture, whereby the sealing effectiveness still being maintained.

Said object is achieved with a feed-through element according to the invention that is to that end characterised in that the sealing element is formed by a split drawing die, that the casing is formed by a holder for the split drawing die, that the split drawing die being set up with play inside the holder and at least a resilient means being inserted in the space between the drawing die and the holder and that a part of the holder being connected in a gastight way to a partition wall of the vacuum apparatus. Preferably, a sealing material is inserted between the drawing die and the holder.

By applying a split drawing die, that is common in the wire producing industry, as sealing element in the treatment of rope, for instance, and by the resilient set-up of this drawing die inside a holder, whereby sealing means furthermore being present between the drawing die and the holder and the holder being fitted in a gastight way in a partition wall of the apparatus; it is attained that excellent sealing is obtained with normal material with wire character, whereby the drawing die furthermore being able to yield should a thickening in the material with wire character suddenly occur, thus avoiding wire rupture. The split drawing die furthermore having a relatively great length and the action of the resilient means being exerted evenly over that length, it is attained that a part of the split drawing die, for instance when starting to feed the thickening through the drawing die, is lifted up whereas the other end of the drawing die is at that moment still resting against the wire material fed through.

The term of "drawing die" mentioned hereinabove is to be understood as referring to a bored object generally made of metal, at least the bore walls of which are made of extra hardened material with a very high resistance to wear.

In particular, in the feed-through element according to the invention, the split drawing die for rope is provided with a centring support within the holder formed by filling elements, whereas the said resilient means resting against at least one of the filling elements. While a sealing material has been inserted between the holder and the filling elements.

Such an arrangement enables the use of a univeral holder, whilst in the case of a changeover from one material with wire character to another material with wire character with a different diameter, the application of filling elements makes it possible to carry out this changeover without problems by replacing the split drawing die and the filling elements.

Moreover, it is noted that the application of such a split drawing die is in itself known in the wire producing industry; such a drawing die is applied, for instance, for the formation of a rope from wire that is provided with a brass covering layer. Through the formation process, an equalization of the brass layer is attained as well, whilst the occurring heat generation causes a homogenization of the layer to occur as a result of diffusion processes.

With advantage, the split drawing die in the feed-through element according to the invention has a rectangular section whilst the resilient means is formed by a leaf spring.

The leaf spring described hereinabove can rest both against the inner side of the holder and, in the case of filling elements being present, against a filling element.

The invention is also embodied in an apparatus for the treatment in vacuum of material with wire character, the material to be treated being continuously fed through the apparatus and the apparatus at least consisting of one or more chambers, means for feeding the material through, means for generating a vacuum and feed-through elements, whereby the apparatus is characterised in that at least part of the feed-through elements is formed by the feed-through element according to the invention.

BRIEF DESCRIPTION OF THE DRAWINGS

The invention will hereinafter be illustrated with reference to the drawing, wherein.

DESCRIPTION OF THE PREFERRED EMBODIMENTS

Figure 1:
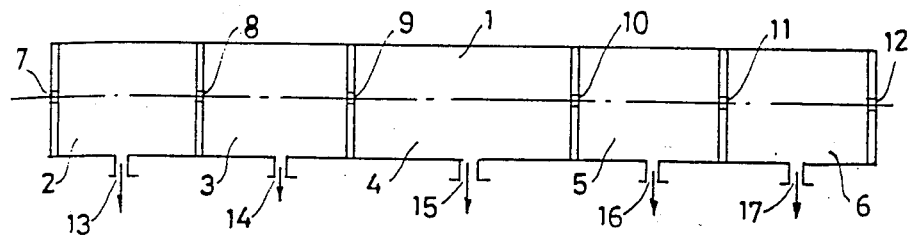
FIG. 1 shows a schmatic section through an apparatus for carrying out a vacuum treatment and wherein one or more feed-through elements according to the invention have been inserted.

In FIG. 1, a vacuum-treatment apparatus for material with wire-shaped character is indicated with general reference number 1. In this case, the apparatus consists of several chambers 2, 3, 4, 5 and 6. Feed-through elements 7 and 12 have been inserted at the beginning and end of the apparatus whilst there are also feed-through elements 8 up to and including 11 between different chambers. Each one of the chambers is connected to a vacuum source via exit 13, 14, 15, 16, and 17. Generally, a so-called rough vacuum will be provided for instance in chambers 2 and 6 via connections 13 and 17, which is obtained by a pump with a very high pumping capacity creating a relatively low vacuum. The chambers 3–5 are connected via their respective exits 14 etc. to one or more vacuum sources that can create a high vacuum. In the apparatus herein described, at least the feed-through elements 7 and 12 will be formed by a feed-through element according to the invention; the feed-through elements indicated with 8 up to and including 11 may be formed by other feed-through elements, although the feed-through elements according to the invention can be utilized with equal success.

Figure 2:
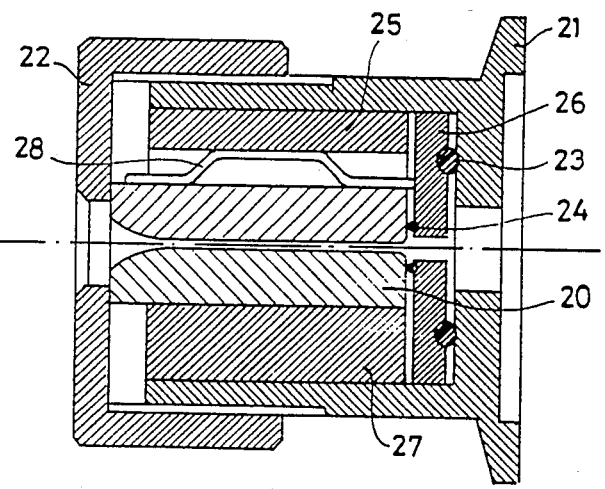
FIG. 2a shows a longitudinal section through a feed-through element according to the invention.
FIG. 2b shows a cross-section through a feed-through element according to the invention.
Figure 2:
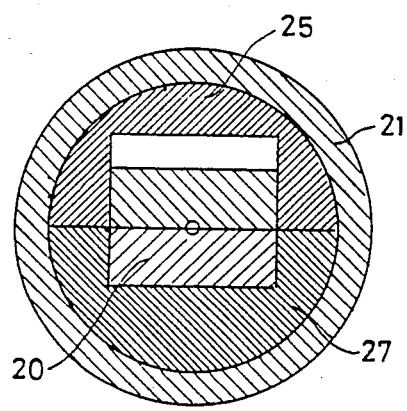

FIG. 2 shows a drawing on an enlarged scale of a feed-through element according to the invention. The core of the feed-through element is the split drawing die 20 that is inserted in a holder composed of 2 parts 21 and 22. In this case, the split drawing die 20 is centred inside the holder parts 21 and 22 by means of filling elements 25, 26, 27.

The application of such filling elements is not imperative; the lower part of the split drawing die 20 may be formed in such a way that it rests against holder part 21 whilst the upper half of the drawing die 20 can also rest against the holder part 21 via the spring means yet to be described.

In the arrangement according to FIG. 2a herein described, filling elements 25, 26 and 27 are present, however, and the upper part of the drawing die 20 is applied via a leaf spring 28 to the filling element 25 that rests against the holder part 21. During normal operation, the parts of the split drawing die 20 fit closely to the outer surface of the material with wire character fed through the bore in the drawing die thus providing a very good sealing.

Now, should the material fed through present a sudden thickening, a weld for instance, this weld will enter the drawing-die arrangement sketched in FIG. 2a at the left-hand side and the upper part of the drawing die 20 will be pushed up despite the presence of the leaf spring 28. The righ-hand side of the drawing die, however, will then still be resting against the surface of the material fed through. This contact at the right-hand side will be maintained until the thickening has reached the middle of the drawing die. After the thickening has passed the middle, it will be the left-hand side of the drawing die that is resting against the wire surface thus providing sufficient sealing. This way, it is obtained that sufficient sealing is guaranteed despite the occurrence of a thickening, while at the same time a thickening does not cause wire rupture.

FIG. 2b is another, cross-sectional, representation of the arrangement according to FIG. 2a. The leaf spring 28 has not been put on FIG. 2b for reasons of clarity; this leaf spring is of course present in reality.

In FIG. 2a, 24 and 23 indicate that there are sealing means between the drawing die 20 and the filling elements on the one hand and the filling elements and the holder on the other. Further, the part of the holder fitted in the partition wall has been fitted into this partition wall in a gastight way. The holder can also have been fitted so that it is detachable, so that even the complete holder can be replaced if necessary. In this case, the sealing means sketched in FIG. 2a have been fitted among other between the filling element 26 and the holder part 21. Such sealing rings can of course also be present between filling elements 25 and 27 and holder 21 while still other versions are possible.

We claim:

1. In a vacuum apparatus having at least one vacuum chamber defined by end walls, said chamber being adapted to receive wire-shaped material fed therethrough so that the material may be treated under vacuum conditions wherein the material may have portions of relatively larger cross section; the improvement comprising: a feed-through element disposed in at least one wall of said chamber, said feed-through element comprising a split drawing die having a surface configured and arranged to closely contact the outer surface of the material fed therethrough so as to provide good sealing engagement therewith, means for holding said split drawing die, resilient means disposed between said die and said holding means for urging said die into said sealing contact with the outer surface of the material fed therethrough including those portions of the material having relatively larger cross sections, and at least one detachable sealing means disposed between said die and said wall so as to enable replacement of said die.

2. In a vacuum apparatus according to claim 1 wherein said split drawing die and resilient means are each of a length in relation to each other such that when portions of material of larger cross section are fed therethrough at least a part of said die remains in contact with the outer surface of said material.

3. In a vacuum apparatus according to claim 1 wherein said resilient means comprises a leaf spring.

4. In a vacuum apparatus according to claim 1 further comprising filling elements disposed between said split drawing die and said holding means to position said die in said holding means, and sealing means disposed between said filling elements and said holding means.

5. In a vacuum apparatus as set forth in claim 1 which includes a plurality of said vacuum chambers between said end walls, the improvement further comprising feed-through elements disposed in at least an entry end wall an exit end wall thereof.

* * * * *

UNITED STATES PATENT AND TRADEMARK OFFICE
CERTIFICATE OF CORRECTION

PATENT NO. : 4,787,227
DATED : November 29, 1988
INVENTOR(S) : Hugo LIEVENS et al It is certified that error appears in the above-identified patent and that said Letters Patent is hereby corrected as shown below:

Column 3, line 5, "schmatic" should read --schematic--,

Claim 5, line 5, between "wall" and "an" add --and--.

Signed and Sealed this

Eighteenth Day of April, 1989

Attest:

DONALD J. QUIGG

*Attesting Officer*  *Commissioner of Patents and Trademarks*